(12) United States Patent
Machida

(10) Patent No.: US 7,545,213 B2
(45) Date of Patent: Jun. 9, 2009

(54) OPERATIONAL AMPLIFIER

(75) Inventor: Hidenori Machida, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 94 days.

(21) Appl. No.: 11/708,053

(22) Filed: Feb. 20, 2007

(65) Prior Publication Data

US 2007/0194847 A1    Aug. 23, 2007

(30) Foreign Application Priority Data

Feb. 22, 2006   (JP)   ............................. 2006-045757

(51) Int. Cl.
*H03F 3/45* (2006.01)
(52) U.S. Cl. ...................................... 330/254; 330/257
(58) Field of Classification Search .................. 330/69, 330/254, 257, 261
See application file for complete search history.

(56) References Cited

U.S. PATENT DOCUMENTS 4,462,003 A * 7/1984 Takamatsu .................. 330/254
6,445,251 B1 * 9/2002 Robinson .................... 330/254
6,734,736 B2 * 5/2004 Gharpurey ................... 330/254

FOREIGN PATENT DOCUMENTS

JP          11-88071           3/1999

* cited by examiner

*Primary Examiner*—Henry K Choe
(74) *Attorney, Agent, or Firm*—McGinn IP Law Group, PLLC

(57) ABSTRACT

An operational amplifier according to an embodiment of the invention includes: a control signal input terminal receiving a digital control signal from an external device; first and second transistors as a differential pair of a differential amplifier circuit; a constant current circuit supplying a predetermined current to the differential pair; a first resistor provided between the constant current circuit and the first transistor and involving a first potential difference; and a second resistor provided between the constant current circuit and the second transistor and involving a second potential difference, the operational amplifier changing a resistance value ratio between the first resistor and the second resistor in accordance with the control signal input to the control signal input terminal.

16 Claims, 5 Drawing Sheets

OPERATIONAL AMPLIFIER

BACKGROUND OF THE INVENTION

1. Field of the Invention

The present invention relates to an operational amplifier, and more particularly to an operational amplifier having an offset correcting function of correcting an input offset.

2. Description of Related Art

An input offset voltage is one of the features of an operational amplifier. The input offset voltage is, for example, a differential voltage between an input voltage and an output voltage of a negative-feedback operational amplifier. In the ideal operational amplifier, it is ideal that the input offset voltage is zero. For realizing the ideal input offset voltage of the operational amplifier, the input offset voltage is externally adjusted in conventional techniques. The technique of externally adjusting the input offset voltage is disclosed in Japanese Unexamined Patent Publication No. 11-88071 (referred to as "Related Art 1").

FIG. 5 shows an offset voltage correcting circuit 100 of the Related Art 1. The offset voltage correcting circuit 100 includes a negative-feedback operational amplifier 101 that amplifies an input voltage applied to a noninverting terminal 114 and feeds the amplified voltage to the next stage. The operational amplifier 101 includes PMOS transistors 102 and 103 as a differential pair and NMOS transistors 108 and 109 as a current mirror circuit. NMOS transistors 118 and 119 are connected between source terminals of NMOS transistors 108 and 109 and the ground through offset correcting terminals 115 and 116, respectively. A power supply voltage VDD is applied to gates of the NMOS transistors 118 and 119 through switches 120 and 121, or a control voltage generated with a DAC (Digital Analog Converter) is applied to the gates through switches 122 and 123.

A resistance value (ON resistance value) of the NMOS transistors 118 and 119 in an ON state is changed in accordance with the control voltage. That is, a gate voltage of the NMOS transistors 118 and 119 is controlled based on the control voltage to thereby control a current ratio between the NMOS transistors 108 and 109 that constitute the current mirror circuit. The offset voltage correcting circuit 100 controls the current ratio in the current mirror circuit through the application of the control voltage to control the input offset voltage.

However, the offset voltage correcting circuit 100 of the Related Art 1 needs to use an analog signal voltage as the control voltage. Hence, in the case of controlling the input offset voltage with a controller such as a microcomputer, a digital control signal output from the microcomputer should be converted into an analog control signal by use of a converter such as a DAC. Further, if the microcomputer includes no DAC, a DAC should be added between the operational amplifier and the microcomputer.

In general, the DAC occupies a very large area. Even if the DAC is externally connected, it is necessary to set aside a given substrate area for the DAC. As a result, it is difficult to downsize a device or reduce a cost in a system that requires the DAC.

SUMMARY OF THE INVENTION

An operational amplifier according to an aspect of the present invention includes: a control signal input terminal receiving a digital control signal from an external device; first and second transistors as a differential pair of a differential amplifier circuit; a constant current circuit supplying a predetermined current to the differential pair; a first resistor provided between the constant current circuit and the first transistor and involving a first potential difference; and a second resistor provided between the constant current circuit and the second transistor and involving a second potential difference, the operational amplifier changing a resistance value ratio between the first resistor and the second resistor in accordance with the control signal input to the control signal input terminal.

Further, an operational amplifier according to another aspect of the invention includes: a control signal input terminal receiving a digital control signal from an external device; first and second transistors as a differential pair of a differential amplifier circuit; a first resistor involving a first potential difference in accordance with an amount of current flowing through the first transistor; and a second resistor involving a second potential difference in accordance with an amount of current flowing through the second transistor, the operational amplifier changing a resistance value ratio between the first resistor and the second resistor in accordance with the control signal input to the control signal input terminal.

According to the operational amplifier of the present invention, it is possible to change a resistance value ratio between resistors connected with one terminal of first and second transistors as a differential pair (for example, emitter terminal) or the other terminal thereof (for example, collector terminal) in accordance with a received digital control signal. Here, since the first and second transistors is a differential pair, if a resistance value of the resistor connected with one terminal or the other terminal is changed, a potential difference occurs between one terminal of the first transistor and one terminal of the second transistor or between the other terminal of the first transistor and the other terminal of the second transistor. The operational amplifier according to the present invention sets a potential difference between control terminals of the first and second transistors (for example, base terminals) based on the potential difference to thereby control an input offset voltage. That is, the operational amplifier of the present invention can control the input offset voltage without converting the digital control signal into an analog signal.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
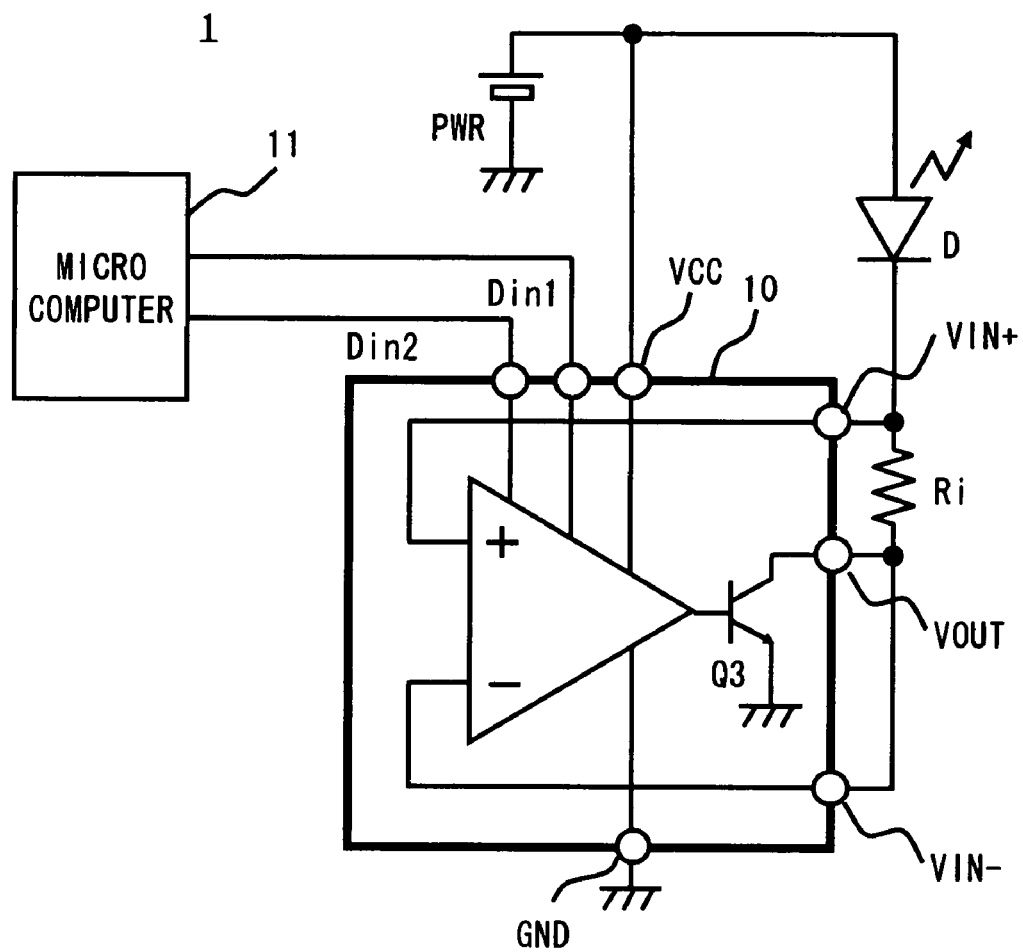
FIG. 1 is a block diagram of an operational amplifier according to a first embodiment of the present invention and its peripheral circuit.

A first embodiment of the present invention is described below with reference to the accompanying drawings. FIG. 1 is a block diagram of an operational amplifier 10 of the first embodiment and its peripheral circuit. As shown in FIG. 1, the operational amplifier 10 of this embodiment includes two input terminals (input terminals VIN+ and VIN−) and one output terminal (output terminal VOUT). A ground terminal GND is connected with a first potential (for example, ground potential), and a power supply terminal VCC is connected with a second potential (for example, power supply PWR). Further, the operational amplifier 10 includes control signal input terminals Din1 and Din2 to which a digital control signal for adjusting a voltage difference between the input terminals VIN+ and VIN− is input from an external device (for example, microcomputer 11).

A resistor Ri is connected between the input terminals VIN+ and VIN− of the operational amplifier 10. Further, the output terminal VOUT is connected with the input terminal VIN−. The operational amplifier 10 sets a voltage difference between the input terminals VIN+ and VIN− (hereinafter referred to as "input offset voltage") in accordance with the digital control signal. A current that is set based on the input offset voltage and a resistance value of the resistor Ri is supplied to an LED (Light Emitting Diode) connected between a power supply PWR and one end of the resistor Ri. The LED changes light emission intensity in accordance with the supplied current. That is, the operational amplifier 10 actively utilizes the input offset voltage. Thus, an input offset voltage level is controlled based on a control signal to thereby control an amount of current supplied to the LED and control the light emission intensity of the LED.

Figure 2:
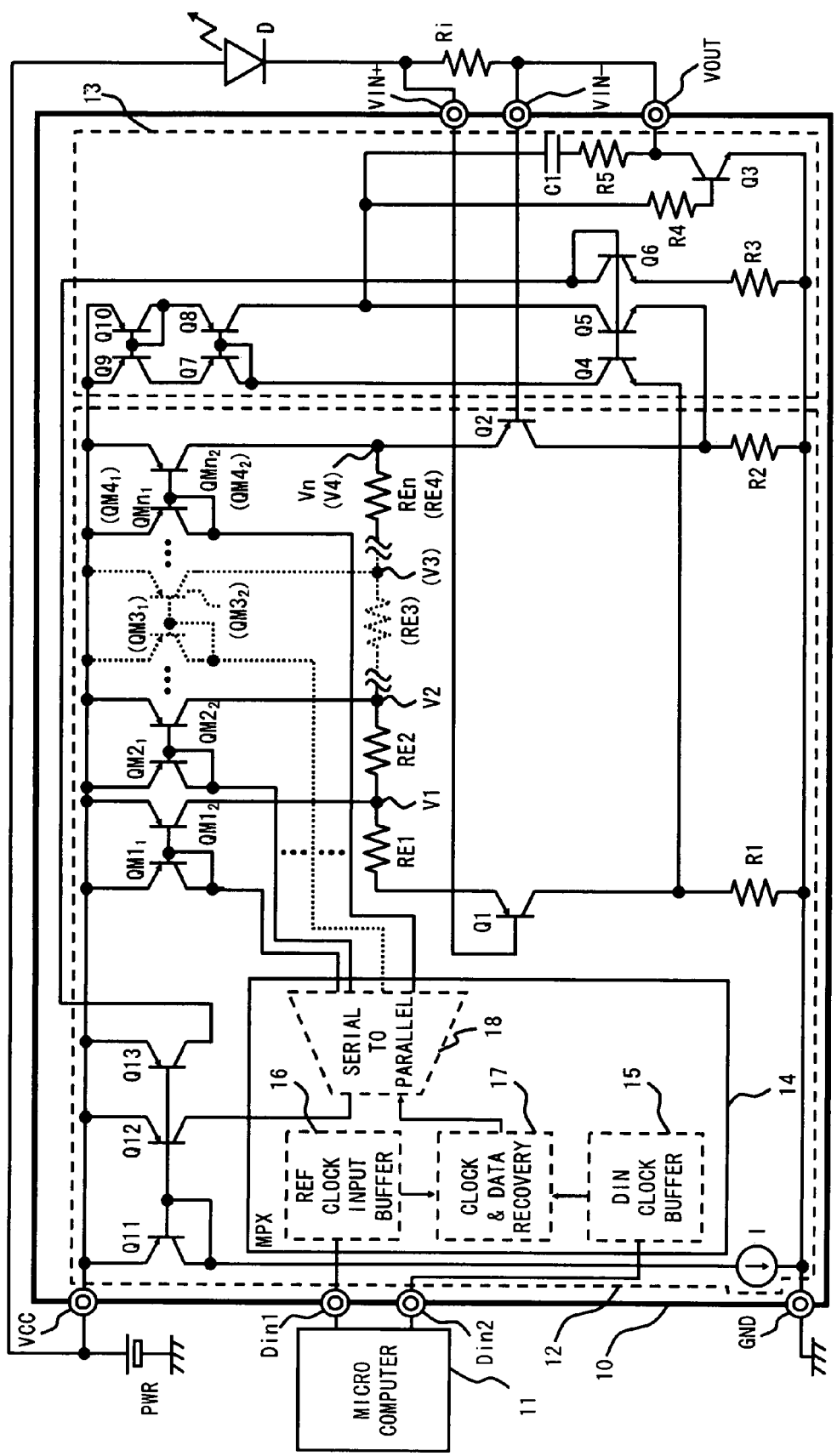
FIG. 2 is a circuit diagram of the operational amplifier of the first embodiment.

The operational amplifier 10 is explained in detail next. FIG. 2 is a circuit diagram of the operational amplifier 10. As shown in FIG. 2, the operational amplifier 10 has an amplifier stage 12 and an output stage 13.

The amplifier stage 12 includes a control unit controlling an input offset voltage and a differential pair receiving an input signal. The control unit includes a current control circuit 14, a constant current circuit, and first and second resistors.

The current control circuit 14 includes a data buffer 15, a reference clock buffer 16, a data synchronizer 17, and a serial/parallel converter 18. The data buffer 15 temporarily stores a digital data signal sent from the microcomputer 11. The reference clock buffer 16 temporarily stores a reference clock transmitted together with the data signal. The data synchronizer 17 sends the data signal as serial data to a serial/parallel converter 18 in sync with the reference clock. The serial/parallel converter 18 receives the data signal sent from the data synchronizer 17 and a current output from the PNP transistor Q12, and its output is connected with plural constant current circuits. The serial/parallel converter 18 selects at least one of the plural connected constant current circuits based on the input data signal to supply a current to the selected constant current circuit.

Here, the current output from the PNP transistor Q12 is substantially the same as a current flowing through a PNP transistor Q11; the PNP transistor Q11 and the PNP transistor Q12 constitute a current mirror circuit. The current flowing through the PNP transistor Q11 is substantially the same as a current generated by a current source I connected between a collector of the PNP transistor Q11 and a ground terminal GND. Here, as will be surmised from the above, if an emitter area ratio between the PNP transistor Q11 and the PNP transistor Q12 is changed, a current ratio of the current mirror circuit can be substantially changed.

The plural constant current circuits are current mirror circuits each including two PNP transistors. The plural constant current circuits have the same configuration. Thus, this embodiment describes, as a first constant current circuit, a constant current circuit composed of PNP transistors $QM1_1$ and $QM1_2$. Base terminals of the PNP transistor $QM1_1$ and $QM1_2$ are connected together, and emitter terminals of the PNP transistors are both connected with a power supply terminal VCC. The PNP transistor $QM1_1$ has a collector terminal connected with a base terminal of the PNP transistor $QM1_1$. Further, the collector terminal of the PNP transistor $QM1_1$ is connected with the current control circuit 14. On the other hand, a collector terminal of the PNP transistor $QM1_2$ is connected with a node V1.

The first and second resistors are connected in series between emitter terminals of the PNP transistors Q1 and Q2 as a differential pair. The first and second resistors are obtained by combining, for example, plural series-connected resistors (resistors RE1 to RE4 of FIG. 2). In this embodiment, the node (node V1) between the resistors RE1 and RE2 is connected with the constant current circuit including the PNP transistor $QM1_2$, the node (node V2) between the resistors RE2 and RE3 is connected with the constant current circuit including the PNP transistor $QM2_2$, the node (node V3) between the resistors RE3 and RE4 is connected with a constant current circuit including the PNP transistor $QM3_2$, and the node (node V4) between the resistor RE4 and the emitter terminal of the NPN transistor Q2 is connected with the constant current circuit including the PNP transistor $QM4_2$.

Among the plural resistors, a resistor connected between the PNP transistor Q1 and the node connected with the constant current circuit where the current control circuit 14 supplies current serves as the first resistor. A resistor connected between the node connected with the constant current circuit and the PNP transistor Q2 serves as the second resistor. For example, if the current control circuit 14 supplies current to the PNP transistor $QM3_1$, the resistors RE1 to RE3 serve as the first resistor, and the resistor RE4 serves as the second resistor. Incidentally, if the current control circuit 14 supplies current to the PNP transistor $QM4_1$, the resistors RE1 to RE4 serve as the first resistor, and the second resistor has a resistance value of substantially 0 Ω. The resistors RE1 to RE4 can be appropriately set in accordance with the specifications. In this embodiment, provided that R represents a reference resistance value, a resistance value ratio among the resistors RE1 to RE4 is expressed as follows: RE1:RE2:RE3:RE4=8R:4R:2R:R.

The differential pair includes the first and second transistors (for example, PNP transistors Q1 and Q2). The PNP transistors Q1 and Q2 each have a control terminal (for example, base terminal), one terminal (for example, emitter terminal), and the other terminal (for example, collector terminal). The base terminal of the PNP transistor Q1 is connected with an input terminal VIN+, and a current flowing into the collector terminal from the emitter terminal is controlled based on a potential difference between the emitter terminal and the base terminal. The base terminal of the PNP transistor Q2 is connected with the input terminal VIN−, and a current flowing into the collector terminal from the emitter terminal is controlled based on a potential difference between the emitter terminal and the base terminal.

The resistors R1 and R2 are connected between the collector terminals of the PNP transistors Q1 and Q2 and the ground terminal GND, respectively. A node between the collector terminal of the PNP transistor Q1 and the resistor R1 is a first output terminal of the amplifier stage 12. Further, a node between the collector terminal of the PNP transistor Q2 and the resistor R2 is a second output terminal of the amplifier stage 12. Incidentally, in this embodiment, resistance values of the resistors R1 and R2 are substantially the same.

The output stage 13 controls the output transistor Q3 based on an output of the amplifier stage 12. The emitter terminal of the output transistor Q3 is connected with the ground terminal GND, and its collector terminal is connected with the output terminal VOUT. In addition, the base terminal of the output transistor Q3 is supplied with a current through the resistor R4. The output transistor Q3 supplies a current from the collector terminal to the emitter terminal in accordance with an amount of current supplied to the base terminal. The current is determined based on a potential difference between the input terminals VIN+ and VIN− and a resistance value of the resistor R1. Further, the capacitor C1 and the resistor R5 connected between the collector terminal of the output transistor Q3 and one end of the resistor R4 execute phase compensation.

A current supplied to the base terminal of the output transistor Q3 varied depending on a difference between a current generated based on voltage values of first and second output terminals of the amplifier stage 12 and supplied from the PNP transistor Q8 and a current drawn to the NPN transistor Q5.

The current supplied from the PNP transistor Q8 is generated with the current mirror circuit composed of the NPN transistors Q6 and Q4 and the current mirror circuit composed of the PNP transistors Q7 and Q8. In the NPN transistor Q6, the resistor R3 is provided between the emitter terminal and the ground terminal GND, and the base terminal and the collector terminal are connected with each other. A current generated with a current source I is supplied to the collector terminal of the NPN transistor Q6 from the current mirror circuit composed of the PNP transistors Q11 and Q13. The emitter terminal of the NPN transistor Q4 is connected with the first output terminal of the amplifier stage 12, and a current that is determined based on a voltage of the first output terminal and a current flowing through the NPN transistor Q6 is supplied from the collector terminal to the emitter terminal.

In the PNP transistor Q7, the collector terminal and the base terminal are connected together, and the collector terminal is connected with the collector terminal of the NPN transistor Q4. As a result, a current substantially the same as a current flowing from the collector terminal to the emitter terminal of the NPN transistor Q4 flows from the emitter terminal to the collector terminal of the PNP transistor Q8. In this example, a current mirror circuit composed of the PNP transistors Q9 and Q10 is connected between the current mirror circuit composed of the PNP transistors Q7 and Q8 and the power supply terminal VCC. The current mirror circuit composed of the PNP transistors Q9 and Q10 reduces the Early effects of the current mirror circuit composed of the PNP transistors Q7 and Q8 and adjusts a base current.

On the other hand, the NPN transistors Q5 and Q6 constitute a current mirror circuit, and the emitter terminal of the NPN transistor Q5 is connected with the second output terminal of the amplifier stage 12. The NPN transistor Q5 controls an amount of current flowing to the NPN transistor Q6 and an amount of current flowing from the collector terminal to the emitter terminal based on a potential of the second output terminal.

Operations of the operational amplifier 10 of the first embodiment are described next. Here, the case of supplying a current to a differential pair from the node V3 is taken as an example. In this case, first, the microcomputer 11 sends a digital control signal to the operational amplifier 10. Based on the control signal, the current control circuit 14 supplies a current to the PNP transistor $QM3_1$. As a result, the differential pair operates based on the current supplied from the node V3. At this time, no current is supplied to all constant current circuits but a constant current circuit composed of the PNP transistor $QM3_1$ and $QM3_2$.

Since the current is supplied from the node V3, the node V3 serves as a common node between the PNP transistors Q1 and Q2. In this embodiment, the PNP transistors Q1 and Q2 operate such that substantially the same current flows from the emitter terminals to the collector terminals of the PNP transistors Q1 and Q2 in a stable manner. That is, the PNP transistors Q1 and Q2 have substantially the same potential difference between the emitter terminal and the base terminal. Provided that I represents a current flowing through the node V3, an amount of current flowing from the node V3 to the emitter terminal of the PNP transistor Q1 is I/2, and an amount of current flowing from the node V3 to the emitter terminal of the PNP transistor Q2 is I/2.

Further, the resistors RE1 to RE3 are series-connected between the common node and the NPN transistor Q1. The resistors RE1 to RE3 function as the first resistor, for example. That is, in this example, a voltage of I/2×(8R+4R+2R) is generated across the first resistor. On the other hand, the resistor RE4 is series-connected between the common node and the NPN transistor Q2. The resistor RE4 functions as the second resistor, for example. That is, in this example, a voltage of I/2×R is generated across the second resistor.

Through the above operations, a potential difference between the emitter terminal of the PNP transistor Q1 and the emitter terminal of the PNP transistor Q2 becomes "I/2×(8R+4R+2R) −I/2×R=I/2×13R". Here, the PNP transistors Q1 and Q2 have substantially the same potential difference between the emitter terminal and the base terminal. Accordingly, a potential difference between the input terminals VIN+ and VIN− equals I/2×13R. Incidentally, in the above description, R represents a reference resistance value; for example, 2R represents a resistance value twice larger than the reference resistance value.

That is, the control unit of this embodiment controls an input offset voltage based on a resistance value difference between the first resistor and the second resistor and a current supplied to the differential pair. In the above description, a current is supplied to the differential pair from the node V3. For example, in the case of supplying a current from the node V2 to the differential pair, a resistance value difference between the first resistor (resistors RE1 and RE2) and the second resistor (resistors RE3 and RE4) is expressed as follows: (8R+4R)−(2R+R)=9R. Accordingly, if a current is supplied from the node V2 to the differential pair, the input offset voltage is I/2×9R.

As understood from the above description, the operational amplifier of the first embodiment supplies a current to any one of the plural constant current circuits based on a digital control signal sent from the microcomputer provided outside the operational amplifier. A resistance value ratio between the first and second resistors that are connected in series between two transistors as the differential pair is changed to thereby control the input offset voltage. That is, according to the operational amplifier circuit of the first embodiment, the input offset voltage can be controlled without converting the digital control signal into an analog signal. Hence, it is possible to dispense with a DAC that is indispensable in the conventional one and to downsize the system configuration and reduce a cost.

Second Embodiment

Figure 3:
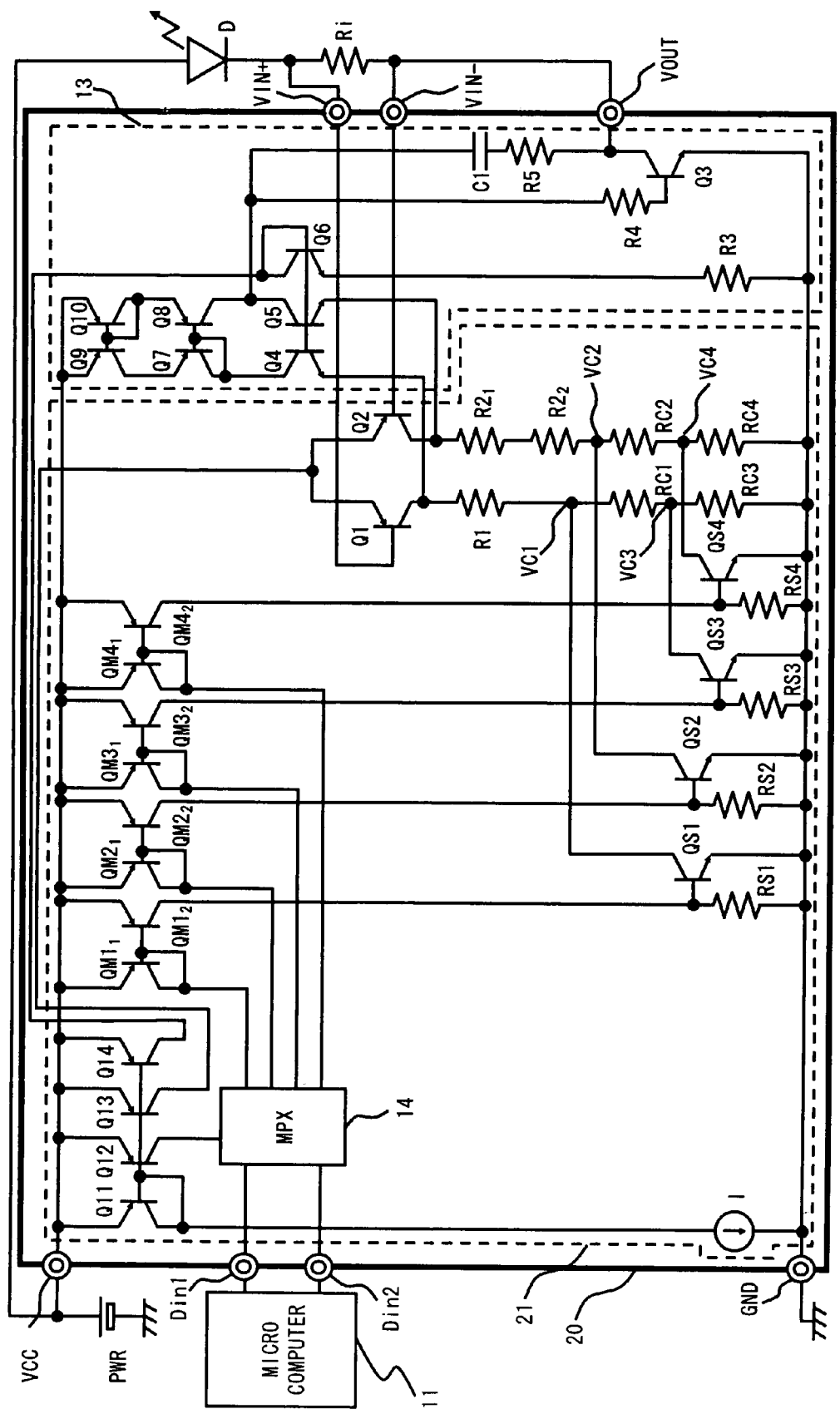
FIG. 3 is a circuit diagram of an operational amplifier according to a second embodiment of the present invention.

FIG. 3 is a circuit diagram of an operational amplifier 20 according to a second embodiment of the present invention. In the operational amplifier 10 of the first embodiment, a resistance value ratio between resistors connected between two transistors and a node from which a current is supplied to the differential pair are changed to thereby control the input offset voltage. In contrast, the operational amplifier 20 of the second embodiment changes a resistance value ratio between resistors connected between one end of one of two transistors as a differential pair (for example, collector terminal) and the ground terminal GND is changed to thereby control the input offset voltage. Here, the same components in the first and second embodiments are denoted by like reference numerals, and description thereof is omitted here.

As shown in FIG. 3, the operational amplifier 20 of the second embodiment includes an amplifier stage 21 and the output stage 13. Here, the output stage 13 is explained in the first embodiment, so its description is omitted here. The amplifier stage 21 includes a control unit and a differential pair.

The control unit includes the current control circuit 14, plural constant current circuits, plural switch circuits, first and second resistors. Here, the current control circuit 14 and the plural constant current circuits are configured as described in the first embodiment, so description thereof is omitted here. Further, one end of the first resistor of the second embodiment is connected with a collector terminal of the PNP transistor Q1. The other end of the first resistor is connected with the ground terminal GND. On the other hand, one end of the second resistor is connected with a collector terminal of the PNP transistor Q2.

The other end of the second resistor is connected with the ground terminal GND. In this embodiment, the first resistor includes series-connected resistors R1, RC1, and RC3. Here, a node between the resistors R1 and RC1 is denoted by a node VC1, and a node between the resistors RC1 and RC3 is denoted by a node VC3. Meanwhile, the second resistor includes series-connected resistor $R2_1$, $2_2$, RC2, and RC4. Here, a node between the resistors $R2_2$ and RC2 is denoted by a node VC2, and a node between the resistors RC2 and RC4 is denoted by a node VC4.

The plural switch circuits are connected between the constant current circuit and the first or second resistor. First to fourth switch circuits connected between the first and second resistors and four constant current circuits are described hereinafter by way of example.

First, the first switch circuit connecting between the first constant current circuit and the first resistor is described. The first, switch circuit includes a resistor RS1 and an NPN transistor QS1. The resistor RS1 is connected between a collector terminal of a PNP transistor $QM1_2$ of the first constant current circuit and the ground terminal GND. Further, a node between the collector terminal of the PNP transistor $QM1_2$ and the resistor R1 is connected with a base terminal of the NPN transistor QS1. An emitter terminal of the NPN transistor QS1 is connected with the ground terminal GND, and a collector terminal thereof is connected with the node VC1.

Next, the second to fourth switch circuits are described. The second to fourth switch circuits include a resistor and an NPN transistor similar to the first switch circuit. In this example, a collector terminal of the NPN transistor QS2 of the second switch circuit is connected with the node VC2, and a collector terminal of the NPN transistor QS3 of the third switch circuit is connected with the node VC3, and a collector terminal of the NPN transistor QS4 of the fourth switch circuit is connected with the node VC4.

Operations of the operational amplifier of the second embodiment are described next. The case of supplying a current to the PNP transistor QM3, based on a control signal is given as an operational example. First, if a digital control signal is input from control signal input terminals Din1 and Din2, a current is supplied to the PNP transistor QM3, based on the control signal to flow through the PNP transistor $QM3_2$. Based on a current output from the PNP transistor $QM3_2$, a voltage is generated across the resistor RS3. The NPN transistor QS3 is turned on in accordance with the voltage. At this time, a potential difference between the collector terminal and emitter terminal of the NPN transistor QS3 is about 0 V (more specifically, about 0.1 V).

As a result, in the first resistor, the resistors R1 and RC1 become effective, and in the second resistor, the resistors R21, R22, RC2, and RC4 become effective. Here, if the same current flows through the PNP transistors Q1 and Q2 as a differential pair, a resistance value of the first resistor is different from that of the second resistor. Accordingly, a potential difference between the collector terminal of the PNP transistor Q1 and the collector terminal of the PNP transistor Q2 occurs. The potential difference is transmitted to the output stage 13 at a subsequent stage. The output stage 13 operates in accordance with the potential difference, with the result that a potential difference between the input terminals VIN+ and VIN− becomes a potential difference between the collector terminal of the PNP transistor Q1 and the collector terminal of the PNP transistor Q2. That is, a potential difference between the collector terminal of the PNP transistor Q1 and the collector terminal of the PNP transistor Q2 corresponds to the input offset voltage.

As understood from the above description, the operational amplifier of the second embodiment supplies a current to any one of the plural constant current circuits based on a digital control signal sent from the microcomputer provided outside the operational amplifier. Thus, a resistance value ratio between the first and second resistors connected in series between the ground terminal and the collector terminal of the two transistors as a differential pair is changed to thereby change a potential difference to be transmitted to the output stage and control the input offset voltage. That is, in the operational amplifier circuit of the second embodiment, the input offset voltage can be controlled without changing a digital control signal to an analog signal similar to the operational amplifier of the first embodiment.

Third Embodiment

Figure 4:
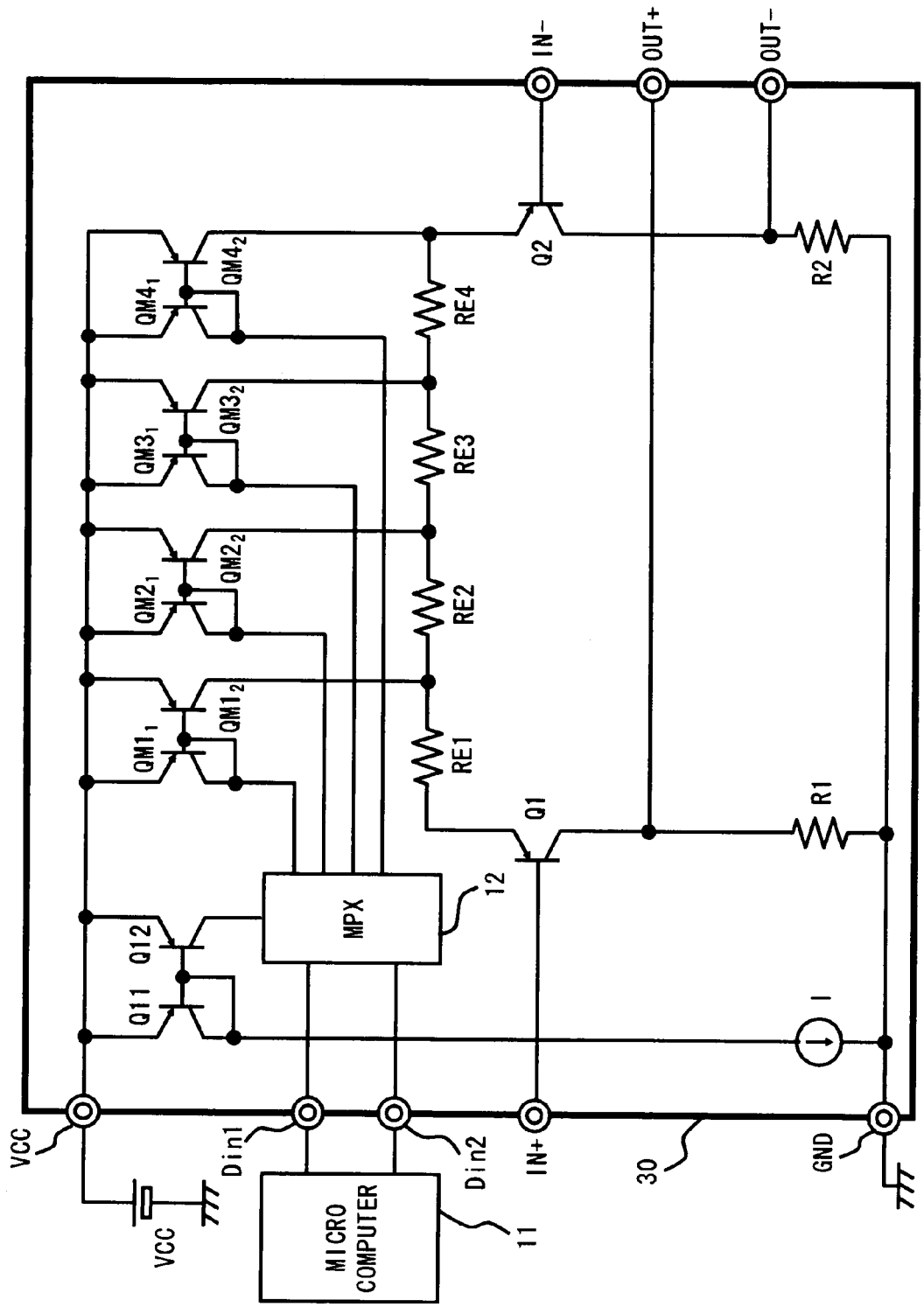
FIG. 4 is a circuit diagram of an operational amplifier according to a third embodiment of the present invention.
Figure 5:
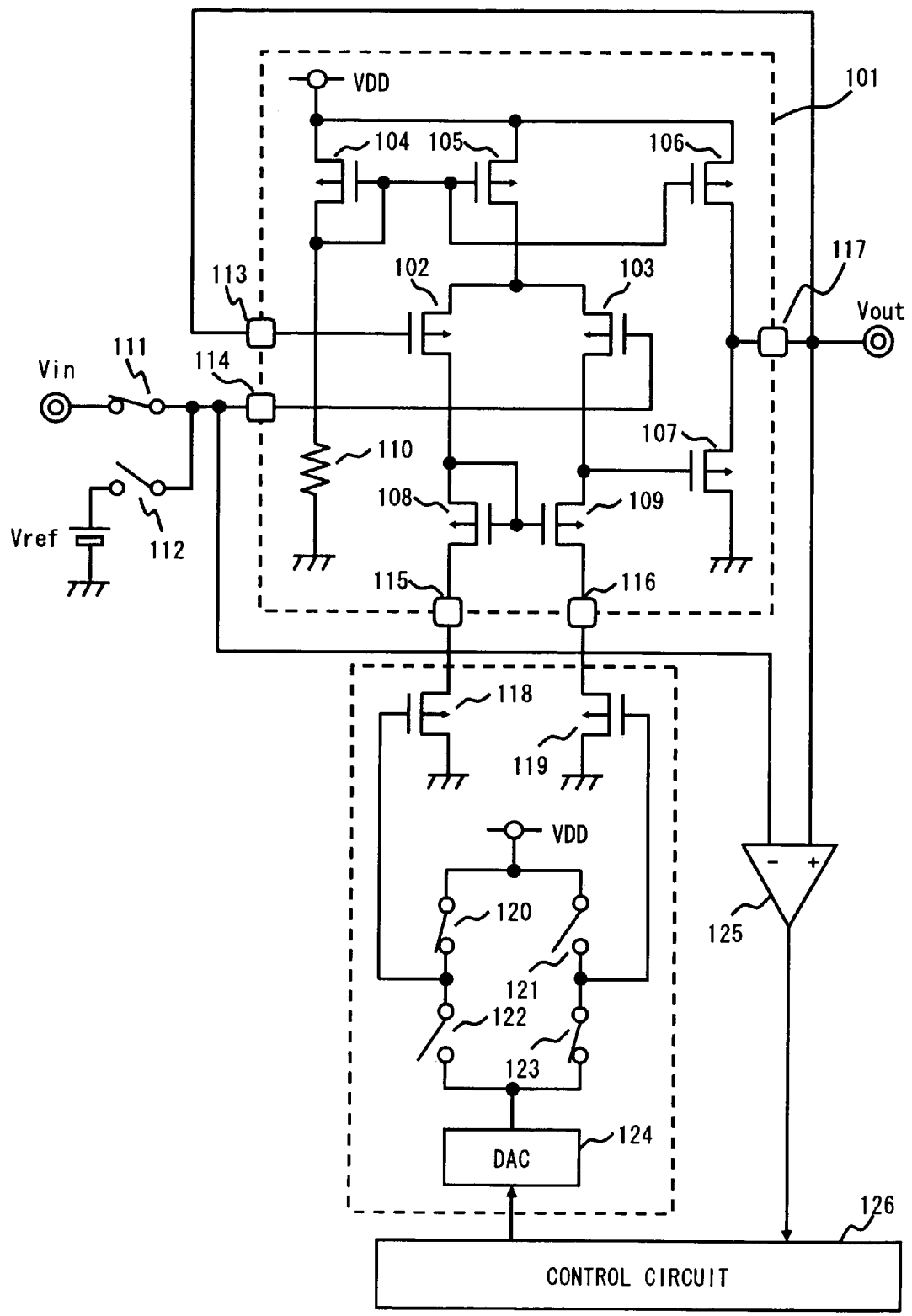
FIG. 5 is a circuit diagram of a conventional operational amplifier.

FIG. 4 is a circuit diagram of an operational amplifier 30 according to a third embodiment of the present invention. The operational amplifier 30 of the third embodiment operates as a 2-input (input terminals VIN+ and VIN−)/2-output (output terminal VOUT+, VOUT−) operational amplifier. Incidentally, in this embodiment, the input terminals VIN+ and VIN− and the output terminals VOUT+ and VOUT− are connected to nothing.

The operational amplifier 30 of the third embodiment controls the input offset voltage based on a digital control signal sent from the microcomputer 11 provided outside the amplifier similar to the first embodiment. An internal circuit of the operational amplifier 30 is described next.

The operational amplifier 30 is completed by connecting the first and second output terminals of the amplifier stage 12 of the operational amplifier 10 of the first embodiment with an external connection terminal (for example, output terminals VOUT+ and VOUT−), for example. Here, in this embodiment, the first output terminal is connected with the output terminal VOUT+, and the second output terminal is connected with the output terminal VOUT−.

That is, the operational amplifier 30 of the third embodiment can adjust the input offset voltage based on the digital control signal similar to the first embodiment and operate as a 2-input/2-output operational amplifier.

Incidentally, the above embodiments describe the control unit inclusive of the first and second resistors. However, as another embodiment, a control unit not including the first and second resistors may be used. Further, in the above embodiment, serial data is used as the control signal, but plural constant current circuits can be individually controlled based on parallel data. If the parallel data is used as the control signal, although the number of control signal input terminals increases, the serial/parallel converter or the like can be omitted, so the circuit can be downsized.

It is apparent that the present invention is not limited to the above embodiment that may be modified and changed without departing from the scope and spirit of the invention.

What is claimed is:

1. An operational amplifier, comprising:
   a control signal input terminal receiving a digital control signal from an external device;
   first and second transistors as a differential pair of a differential amplifier circuit;
   a constant current circuit supplying a predetermined current to the differential pair;
   a first resistor provided between the constant current circuit and the first transistor and involving a first potential difference; and
   a second resistor provided between the constant current circuit and the second transistor and involving a second potential difference,
   the operational amplifier changing a resistance value ratio between the first resistor and the second resistor in accordance with the control signal input to the control signal input terminal.

2. The operational amplifier according to claim 1, wherein the first resistor and the second resistor are connected in series between the first and second transistors, and
   the first resistor is a resistor connected between the constant current circuit supplying a current to the differential pair and the first transistor, and the second resistor is a resistor connected between the constant current circuit and the second transistor.

3. The operational amplifier according to claim 1, wherein the constant current circuit includes a plurality of constant current circuits, and the first and second resistors include a plurality of resistors, the plurality of constant current circuits are individually connected to nodes where the plurality of resistors is divided into a predetermined resistance ratio, and at least one of the plurality of constant current circuits supplies the predetermined current to the differential pair based on the control signal.

4. The operational amplifier according to claim 1, wherein the first and second potential differences occur across the first resistor and the second resistor in accordance with a current value output from the constant current circuit and resistance values of the first resistor and the second resistor.

5. The operational amplifier according to claim 1, wherein the operational amplifier changes a resistance value ratio between the first resistor and the second resistor in accordance with the control signal sent as serial data.

6. The operational amplifier according to claim 1, wherein the operational amplifier changes a resistance value ratio between the first resistor and the second resistor in accordance with the control signal sent as parallel data.

7. An operational amplifier, comprising: first and second transistors configured as a differential pair of a differential amplifier circuit; and
   a control unit connected between one terminal of the first transistor and one terminal of the second transistor with a potential of the one terminal of the first transistor set as a first potential and a potential of the one terminal of the second transistor set as a second potential, said control unit providing a correction for an offset voltage of said operational amplifier.

8. The operational amplifier according to claim 7, wherein the control unit includes a plurality of resistor connected between the one terminal of the first transistor and the one terminal of the second transistor, and a constant current circuit supplying a current to the first and second transistors, and the constant current circuit supplies a current to the differential pair from a node where resistors are divided into the plurality of resistor at a predetermined resistance ratio in accordance with the control signal.

9. The operational amplifier according to claim 8, wherein the first potential is set based on a resistance value of the first resistor connected between a node connected with the constant current circuit and the one terminal of the first transistor and a current flowing through the first transistor,
   the second potential is set based on a resistance value of the second resistor connected between the node connected with the constant current circuit and the one terminal of the second transistor and a current flowing through the second transistor.

10. The operational amplifier according to claim 7, wherein the control unit includes a first resistor connected with the one terminal of the first transistor, a second resistor connected with the one terminal of the second transistor, and
    a plurality of switch circuits connected to nodes where resistors are divided into the first resistor and the second resistor at a predetermined resistance ratio,
    the plurality of switch circuits are turned on/off in accordance with the control signal to change a resistance value ratio between the first resistor and the second resistor.

11. The operational amplifier according to claim 10, wherein the first potential is set based on a resistance value of the first resistor and a current flowing through the first transistor, and the second potential is set based on a resistance value of the second resistor and a current flowing through the second transistor.

12. The operational amplifier according to claim 1, wherein said changing resistance value ratio between the first resistor and the second resistor changes an offset voltage of said operational amplifier.

13. The operational amplifier according to claim 1, wherein said constant current circuit comprises a plurality of current mirrors selectively controlled by said control signal.

14. The operational amplifier according to claim 1, wherein said control circuit comprises a serial to parallel circuit that selectively controls a plurality of current mirrors in accordance with said control signal input.

15. The operational amplifier according to claim 1, wherein said control circuit comprises a multiplexer that selectively controls a plurality of current mirrors in accordance with said control signal input.

16. The operational amplifier according to claim 8, wherein said constant current circuit comprises a plurality of current mirror circuits selectively controlled by said control signal.

* * * * *